(12) United States Patent
Lee et al.

(10) Patent No.: US 8,483,639 B2
(45) Date of Patent: Jul. 9, 2013

(54) AGC FOR SLICER-BASED LOW POWER DEMODULATOR

(75) Inventors: Chong U. Lee, San Diego, CA (US);
Amal Ekbal, San Diego, CA (US);
David Jonathan Julian, San Diego, CA (US); Jun Shi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1010 days.

(21) Appl. No.: 12/116,155

(22) Filed: May 6, 2008

(65) Prior Publication Data

US 2009/0278606 A1 Nov. 12, 2009

(51) Int. Cl.
*H04B 1/06* (2006.01)

(52) U.S. Cl.
USPC ........................................ 455/234.1; 375/345

(58) Field of Classification Search
USPC .................. 455/232.1, 234.1, 234.2; 375/345
See application file for complete search history.

(56) References Cited

U.S. PATENT DOCUMENTS

| | | | |
|---|---|---|---|
| 5,687,169 A | 11/1997 | Fullerton | |
| 5,764,696 A | 6/1998 | Barnes et al. | |
| 5,812,081 A | 9/1998 | Fullerton | |
| 5,832,035 A | 11/1998 | Fullerton | |
| 5,907,427 A | 5/1999 | Scalora et al. | |
| 5,952,956 A | 9/1999 | Fullerton | |
| 5,960,031 A | 9/1999 | Fullerton et al. | |
| 5,963,581 A | 10/1999 | Fullerton et al. | |
| 5,969,663 A | 10/1999 | Fullerton et al. | |
| 5,995,534 A | 11/1999 | Fullerton et al. | |
| 6,031,862 A | 2/2000 | Fullerton et al. | |
| 6,091,374 A | 7/2000 | Barnes | |
| 6,111,536 A | 8/2000 | Richards et al. | |
| 6,133,876 A | 10/2000 | Fullerton et al. | |
| 6,177,903 B1 | 1/2001 | Fullerton et al. | |
| 6,218,979 B1 | 4/2001 | Barnes et al. | |
| 6,295,019 B1 | 9/2001 | Richards et al. | |
| 6,297,773 B1 | 10/2001 | Fullerton et al. | |
| 6,300,903 B1 | 10/2001 | Richards et al. | |
| 6,304,623 B1 | 10/2001 | Richards et al. | |
| 6,351,652 B1 | 2/2002 | Finn et al. | |
| 6,354,946 B1 | 3/2002 | Finn | |
| 6,400,307 B2 | 6/2002 | Fullerton et al. | |

(Continued)

FOREIGN PATENT DOCUMENTS

| CN | 1135130 A | 11/1996 |
|---|---|---|
| CN | 1614883 A | 5/2005 |

(Continued)

OTHER PUBLICATIONS

Filiol N et al: "A 22mW biuetooth RF transceiver with direct RF modulation and on_chip IF filtering" Solid-State Circuits Conference, 2001. Digest of Technical Papers. ISS CC. 2001 IEEE International Feb. 5-7, 2001, Piscataway, NJ, USA, IEEE, Feb. 5, 2001, pp. 202-447, XP010536237.

(Continued)

*Primary Examiner* — Nguyen Vo
(74) *Attorney, Agent, or Firm* — Paul S. Holdaway

(57) ABSTRACT

An apparatus and method for performing automatic gain control in a receiver are disclosed. The apparatus may include an amplifier, and the gain control may be based on an output from the amplifier during a time period in which a target signal is not present at the output of the amplifier.

32 Claims, 6 Drawing Sheets

U.S. PATENT DOCUMENTS

| | | |
|---|---|---|
| 6,400,329 B1 | 6/2002 | Barnes |
| 6,421,389 B1 | 7/2002 | Jett et al. |
| 6,424,630 B1 | 7/2002 | Ang |
| 6,430,208 B1 | 8/2002 | Fullerton et al. |
| 6,437,756 B1 | 8/2002 | Schantz |
| 6,462,701 B1 | 10/2002 | Finn |
| 6,466,125 B1 | 10/2002 | Richards et al. |
| 6,469,628 B1 | 10/2002 | Richards et al. |
| 6,483,461 B1 | 11/2002 | Matheney et al. |
| 6,489,893 B1 | 12/2002 | Richards et al. |
| 6,492,904 B2 | 12/2002 | Richards |
| 6,492,906 B1 | 12/2002 | Richards et al. |
| 6,501,393 B1 | 12/2002 | Richards et al. |
| 6,504,483 B1 | 1/2003 | Richards et al. |
| 6,512,455 B2 | 1/2003 | Finn et al. |
| 6,512,488 B2 | 1/2003 | Schantz |
| 6,519,464 B1 | 2/2003 | Santhoff et al. |
| 6,529,568 B1 | 3/2003 | Richards et al. |
| 6,538,615 B1 | 3/2003 | Schantz |
| 6,539,213 B1 | 3/2003 | Richards et al. |
| 6,549,567 B1 | 4/2003 | Fullerton |
| 6,552,677 B2 | 4/2003 | Barnes et al. |
| 6,556,621 B1 | 4/2003 | Richards et al. |
| 6,560,463 B1 | 5/2003 | Santhoff |
| 6,571,089 B1 | 5/2003 | Richards et al. |
| 6,573,857 B2 | 6/2003 | Fullerton et al. |
| 6,577,691 B2 | 6/2003 | Richards et al. |
| 6,585,597 B2 | 7/2003 | Finn |
| 6,593,886 B2 | 7/2003 | Schantz |
| 6,606,051 B1 | 8/2003 | Fullerton et al. |
| 6,611,234 B2 | 8/2003 | Fullerton et al. |
| 6,614,384 B2 | 9/2003 | Hall et al. |
| 6,621,462 B2 | 9/2003 | Barnes |
| 6,636,566 B1 | 10/2003 | Roberts et al. |
| 6,636,567 B1 | 10/2003 | Roberts et al. |
| 6,636,573 B2 | 10/2003 | Richards et al. |
| 6,642,903 B2 | 11/2003 | Schantz |
| 6,661,342 B2 | 12/2003 | Hall et al. |
| 6,667,724 B2 | 12/2003 | Barnes et al. |
| 6,670,909 B2 | 12/2003 | Kim |
| 6,671,310 B1 | 12/2003 | Richards et al. |
| 6,674,396 B2 | 1/2004 | Richards et al. |
| 6,677,796 B2 | 1/2004 | Brethour et al. |
| 6,700,538 B1 | 3/2004 | Richards |
| 6,710,736 B2 | 3/2004 | Fullerton et al. |
| 6,717,992 B2 | 4/2004 | Cowie et al. |
| 6,748,040 B1 | 6/2004 | Johnson et al. |
| 6,750,757 B1 | 6/2004 | Gabig, Jr. et al. |
| 6,759,948 B2 | 7/2004 | Grisham et al. |
| 6,760,387 B2 | 7/2004 | Langford et al. |
| 6,762,712 B2 | 7/2004 | Kim |
| 6,763,057 B1 | 7/2004 | Fullerton et al. |
| 6,763,282 B2 | 7/2004 | Glenn et al. |
| 6,774,846 B2 | 8/2004 | Fullerton et al. |
| 6,774,859 B2 | 8/2004 | Schantz et al. |
| 6,778,603 B1 | 8/2004 | Fullerton et al. |
| 6,781,530 B2 | 8/2004 | Moore |
| 6,782,048 B2 | 8/2004 | Santhoff |
| 6,788,730 B1 | 9/2004 | Richards et al. |
| 6,822,604 B2 | 11/2004 | Schantz et al. |
| 6,823,022 B1 | 11/2004 | Fullerton et al. |
| 6,836,223 B2 | 12/2004 | Moore |
| 6,836,226 B2 | 12/2004 | Moore |
| 6,845,253 B1 | 1/2005 | Schantz |
| 6,847,675 B2 | 1/2005 | Fullerton et al. |
| 6,879,878 B2 | 4/2005 | Glenn et al. |
| 6,882,301 B2 | 4/2005 | Fullerton |
| 6,895,034 B2 | 5/2005 | Nunally et al. |
| 6,900,732 B2 | 5/2005 | Richards |
| 6,906,625 B1 | 6/2005 | Taylor et al. |
| 6,907,244 B2 | 6/2005 | Santhoff et al. |
| 6,912,240 B2 | 6/2005 | Kumar et al. |
| 6,914,949 B2 | 7/2005 | Richards et al. |
| 6,917,284 B2 | 7/2005 | Grisham et al. |
| 6,919,838 B2 | 7/2005 | Santhoff |
| 6,922,166 B2 | 7/2005 | Richards et al. |
| 6,922,177 B2 | 7/2005 | Barnes et al. |
| 6,925,109 B2 | 8/2005 | Richards et al. |
| 6,933,882 B2 | 8/2005 | Fullerton |
| 6,937,639 B2 | 8/2005 | Pendergrass et al. |
| 6,937,663 B2 | 8/2005 | Jett et al. |
| 6,937,667 B1 | 8/2005 | Fullerton et al. |
| 6,937,674 B2 | 8/2005 | Santhoff et al. |
| 6,947,492 B2 | 9/2005 | Santhoff et al. |
| 6,950,485 B2 | 9/2005 | Richards et al. |
| 6,954,480 B2 | 10/2005 | Richards et al. |
| 6,959,031 B2 | 10/2005 | Haynes et al. |
| 6,959,032 B1 | 10/2005 | Richards et al. |
| 6,963,727 B2 | 11/2005 | Shreve |
| 6,980,613 B2 | 12/2005 | Krivokapic |
| 6,989,751 B2 | 1/2006 | Richards |
| 7,015,793 B2 | 3/2006 | Gabig, Jr. et al. |
| 7,020,224 B2 | 3/2006 | Krivokapic |
| 7,027,425 B1 | 4/2006 | Fullerton et al. |
| 7,027,483 B2 | 4/2006 | Santhoff et al. |
| 7,027,493 B2 | 4/2006 | Richards |
| 7,030,806 B2 | 4/2006 | Fullerton |
| 7,042,417 B2 | 5/2006 | Santhoff et al. |
| 7,046,187 B2 | 5/2006 | Fullerton et al. |
| 7,046,618 B2 | 5/2006 | Santhoff et al. |
| 7,069,111 B2 | 6/2006 | Glenn et al. |
| 7,075,476 B2 | 7/2006 | Kim |
| 7,079,827 B2 | 7/2006 | Richards et al. |
| 7,099,367 B2 | 8/2006 | Richards et al. |
| 7,099,368 B2 | 8/2006 | Santhoff et al. |
| 7,129,886 B2 | 10/2006 | Hall et al. |
| 7,132,975 B2 | 11/2006 | Fullerton et al. |
| 7,145,954 B1 | 12/2006 | Pendergrass et al. |
| 7,148,791 B2 | 12/2006 | Grisham et al. |
| 7,151,490 B2 | 12/2006 | Richards |
| 7,167,525 B2 | 1/2007 | Santhoff et al. |
| 7,170,408 B2 | 1/2007 | Taylor et al. |
| 7,184,938 B1 | 2/2007 | Lansford et al. |
| 7,190,722 B2 | 3/2007 | Lakkis et al. |
| 7,190,729 B2 | 3/2007 | Siwiak |
| 7,206,334 B2 | 4/2007 | Siwiak |
| 7,209,724 B2 | 4/2007 | Richards et al. |
| 7,230,980 B2 | 6/2007 | Langford et al. |
| 7,239,277 B2 | 7/2007 | Fullerton et al. |
| RE39,759 E | 8/2007 | Fullerton |
| 7,256,770 B2 | 8/2007 | Fullerton et al. |
| 7,271,779 B2 | 9/2007 | Hertel |
| 2003/0162518 A1* | 8/2003 | Baldwin et al. ............ 455/253.2 |
| 2006/0120491 A1* | 6/2006 | Yen et al. ..................... 375/345 |

FOREIGN PATENT DOCUMENTS

| | | |
|---|---|---|
| EP | 748500 | 5/1956 |
| GB | 748500 A | 5/1956 |
| JP | 8184666 A | 7/1996 |
| JP | 9163015 A | 6/1997 |
| JP | 2006340212 A | 12/2006 |
| JP | 2007148957 A | 6/2007 |
| JP | 2007151058 A | 6/2007 |

OTHER PUBLICATIONS

Kuang-Hu Huang et al: "A 2-V 7.2[deg.] Jitter AM-Suppression CMOS Amplifier Using Current-Mode Hybrid Magnitude Control" IEEE Journal of Solid-State Circuits, IEEE Service Center, Piscataway, NJ, US, vol. 34, No. 10, Oct. 1, 1999, XP011061091.
International Search Report—PCT/US08/063080, International Search Authority—European Patent Office—Nov. 27, 2008.
Written Opinion—PCT/US08/063080, International Search Authority—European Patent Office—Nov. 27, 2008.
Taiwan Search Report—TW097123536—TIPO—May 21, 2011.

* cited by examiner

AGC FOR SLICER-BASED LOW POWER DEMODULATOR

BACKGROUND

1. Field

The present disclosure relates generally to communication systems, and more particularly, to concepts and techniques for performing automatic gain control in a receiver.

2. Background

Peer-to-peer networks are commonly used for connecting wireless devices via adhoc connections. These networks differ from the traditional client-server model where communications are usually with a central server. A peer-to-peer network has only equal peer devices that communicate directly with one another. Such networks are useful for many purposes. A peer-to-peer network may be used, for example, as a consumer electronic wire replacement system for short range or indoor applications. These networks are sometimes referred to as Wireless Personal Area Networks (WPAN) and are useful for efficiently transferring video, audio, voice, text, and other media between wireless devices over a short distance.

A WPAN may provide connectivity for devices in a home or a small office or may be used to provide connectivity for devices carried by a person. In a typical scenario, a WPAN may provide connectivity for devices within a range on the order of tens of meters. In some applications, a portable device such as a cell phone may communicate with a headset using, by way of example, pulsed-Ultra Wide-Band (UWB) communications. Devices that consume relatively small amounts of power are generally desirable in these and other types of applications. Low power consumption in such devices allows for a small battery size and/or prolonged battery life, for example.

To this end, physical layer design approaches implementing pulsed-UWB technologies with Pulse Position Modulation (PPM), by way of example, have been utilized for low power and low complexity system design. However, the RF design required to implement such architectures faces significant challenges, such as those that stem from the analog energy detector-based PPM demodulator. In certain applications, the implementation of a slicer based architecture with digital demodulation is an efficient way to reduce power consumption compared to energy integration based approaches.

At the same time, the slicer based architecture, in general, requires a very fine automatic gain control (AGC). Setting a fine AGC level, especially in UWB systems, can have significant power consumption costs and/or link budget costs, and thereby, negate any advantages the slicer based architecture has in terms of power savings. Accordingly, there is a need for art for a methodology that enables fine AGC estimation with minimum power consumption and link budget costs.

SUMMARY

According to an aspect of the disclosure, an apparatus includes an amplifier, and an automatic gain control configured to determine a gain for the amplifier based on an output from the amplifier during a time period in which a target signal is not present at the output of the amplifier.

According to another aspect of the disclosure, an apparatus includes means for amplifying a target signal, and means for automatically controlling a gain for the amplifying means based on an output from the amplifying means during a time period in which the target signal is not present at the output of the amplifying means.

According to a further aspect of the disclosure, a method of automatic gain control includes amplifying a target signal with an amplifier, and automatically controlling a gain for the amplifier based on an output from the amplifier means during a time period in which the target signal is not present at the output of the amplifier.

According to yet a further aspect of the disclosure, a computer-program product for automatically controlling a gain of an amplifier includes computer-readable medium comprising codes executable to determine a gain for the amplifier based on an output from the amplifier during a time period in which a target signal is not present at the output of the amplifier.

According to another aspect of the disclosure, a headset includes an amplifier, an automatic gain control configured to determine a gain for the amplifier based on an output from the amplifier during a time period in which a target signal is not present at the output of the amplifier, and a transducer configured to generate sound based on the target signal.

According to yet another aspect of the disclosure, a watch includes an amplifier, an automatic gain control configured to determine a gain for the amplifier based on an output from the amplifier during a time period in which a target signal is not present at the output of the amplifier, and a user interface configured to provide an indication based on the target signal.

According to yet a further aspect of the disclosure, a sensing device includes an amplifier, an automatic gain control configured to determine a gain for the amplifier based on an output from the amplifier during a time period in which a target signal is not present at the output of the amplifier, and a sensor configured to generate data based on the target signal.

It is understood that other aspects of the invention will become readily apparent to those skilled in the art from the following detailed description, wherein it is shown and described only various aspects of the invention by way of illustration. As will be realized, the invention is capable of other and different aspects and its several details are capable of modification in various other respects, all without departing from the scope of the invention. Accordingly, the drawings and detailed description are to be regarded as illustrative in nature and not as restrictive.

BRIEF DESCRIPTION OF THE DRAWINGS

Various aspects of the present disclosure are illustrated by way of example, and not by way of limitation, in the accompanying drawings, wherein.

DETAILED DESCRIPTION

Figure 1:
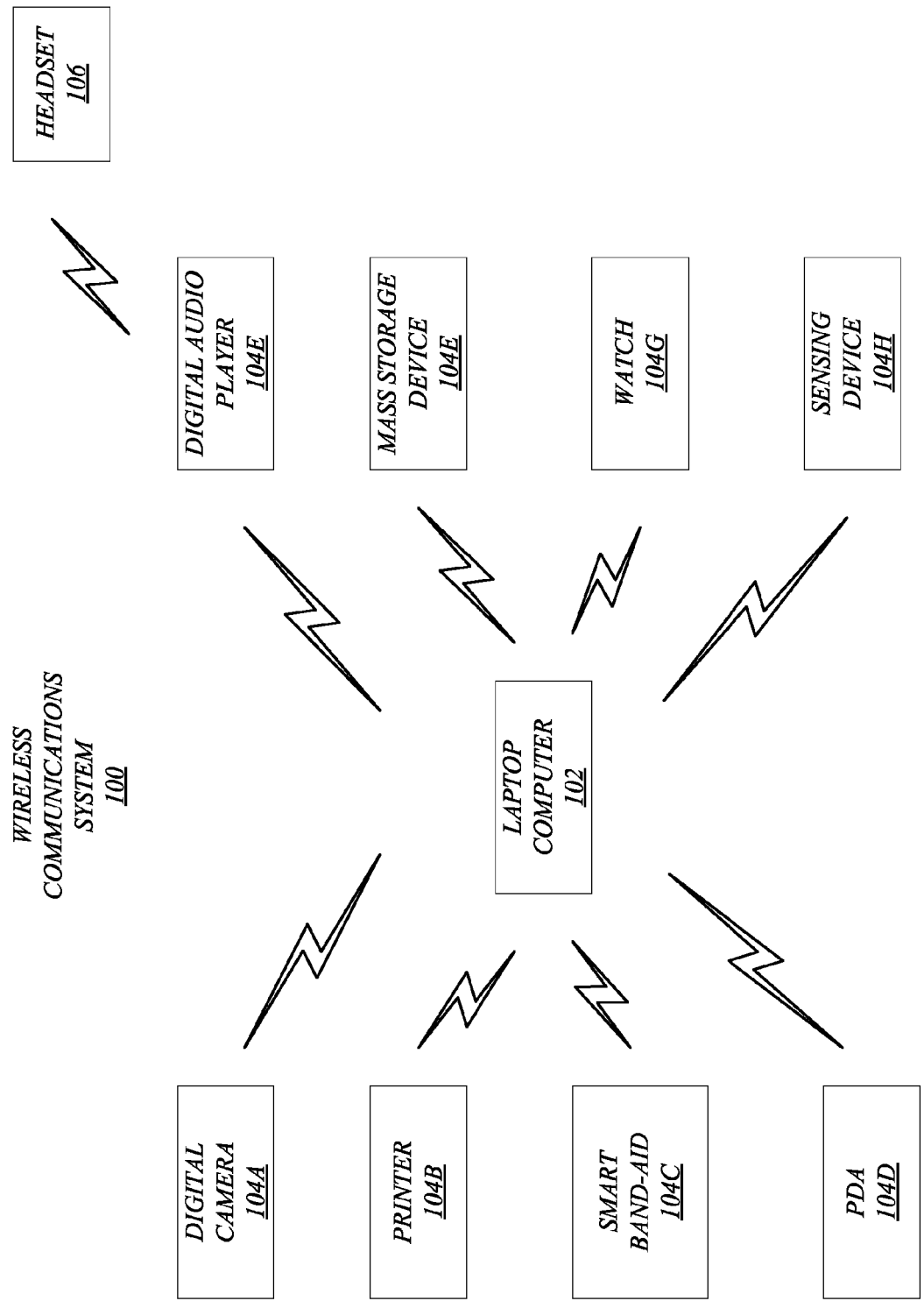
FIG. 1 is a conceptual diagram illustrating an example of a wireless communications system.

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. An aspect may comprise one or more elements of a claim.

Several aspects of a receiver will now be presented. The receiver may be incorporated into a variety of devices such as, by way of example, a headset, a microphone, a medical device, a biometric sensor, a heart rate monitor, a pedometer, an EKG device, a user I/O device, a watch, a remote control, a switch, a tire pressure monitor, an entertainment device, a computer, a point-of-sale device, a hearing aid, a set-top box, a cell phone, or some other device with some form of wireless signaling capabilities. The devices may include various components that perform functions bases on signals transmitted or received via the wireless communication link. By way of example, a headset may include a transducer adapted to provide an audible output based on a signal received via the wireless communication link. A watch may include a display adapted to provide a visual output based on a signal received via the wireless communication link. A medical device may include a sensor adapted to generate sensed signals to be transmitted via the wireless communication link.

Alternatively, the receiver may be incorporated into an access device (e.g., a Wi-Fi access point) for a communication system. By way of example, the device may provide connectivity to another network (e.g., a wide area network such as the Internet) via a wired or wireless communication link. Accordingly, the device may enable the device 102 (e.g., a Wi-Fi station) to access the other network.

In some configurations, the receiver may be part of an access point that provides access to other nodes a wireless network. In many applications, the receiver may be part of a device that transmits as well as receives. Such a device would therefore require a transmitter, which may be a separate component or integrated with the receiver into a single component known as a "transceiver." As those skilled in the art will readily appreciate, the various concepts described throughout this disclosure are applicable to any suitable receiver function, regardless of whether the receiver is a stand-alone device, integrated into a transceiver, or part of a node in a wireless communications system.

The teachings herein may be adapted for use in low power applications (e.g., through the use of a pulse-based signaling scheme and low duty cycle modes) and may support a variety of data rates including relatively high data rates (e.g., through the use of high-bandwidth pulses). As an example, a device incorporating various aspects of a receiver may utilize ultra-wideband (UWB) pulses that have a relatively short length (e.g., on the order of a few nanoseconds) and a relatively wide bandwidth. Because pulsed-UWB signals are transmitted in very short pulses that consume very little power, this technology is well suited for many applications. However, as those skilled in the art will readily appreciate, the various aspects presented throughout this disclosure are likewise applicable to receivers for various other wireless communication systems. Accordingly, any reference to a pulsed-UWB system is intended only to illustrate various aspects, with the understanding that such aspects have a wide range of applications. By way of example, various aspects disclosed throughout this disclosure may be applied to receivers for Bluetooth, 802.11, and other wireless technologies.

An example of a wireless communications system will now be presented with reference to FIG. 1. The wireless communications system 100 is shown with a laptop computer 102 in communication with various other wireless nodes 104. In this example, the computer 102 may receive digital photos from a digital camera 104A, send documents to a printer 104B for printing, communicate with a smart band-aid 104C, synch-up with e-mail on a Personal Digital Assistant (PDA) 104D, transfer music files to a digital audio player (e.g., MP3 player) 104E, back up data and files to a mass storage device 104F, set the time on a watch 104G, and receive data from a sensing device 104H (e.g., a medical device such as a biometric sensor, a heart rate monitor, a pedometer, an EKG device, etc.). Also shown is a headset 106 (e.g., headphones, earpiece, etc.) that receives audio from the digital audio player 104E.

In one configuration of the wireless communications system 100, the computer 102 provides an access point to a Wide Area Network (WAN) (i.e., a wireless network covering a regional, nationwide, or even a global region). One common example of a WAN is the Internet. Another example of a WAN is a cellular network that supports CDMA2000, a telecommunications standard that uses Code Division Multiple Access (CDMA) to send voice, data, and signaling between mobile subscribers. A cellular network is sometimes referred to as a Wireless Wide Area Network (WWAN). Another example of a WWAN is a cellular network that provides broadband Internet access to mobile subscribers, such as Evolution-Data Optimized (EV-DO) or Ultra Mobile Broadband (UMB), both of which are part of the CDMA2000 family of air interface standards. Alternatively, or in addition to, the computer 102 may have a UWB connection to an Ethernet modem, or some other interface to a Local Area Network (LAN) (i.e., a network generally covering tens to a few hundred meters in homes, offices buildings, coffee shops, transportation hubs, hotels, etc.).

Figure 2:
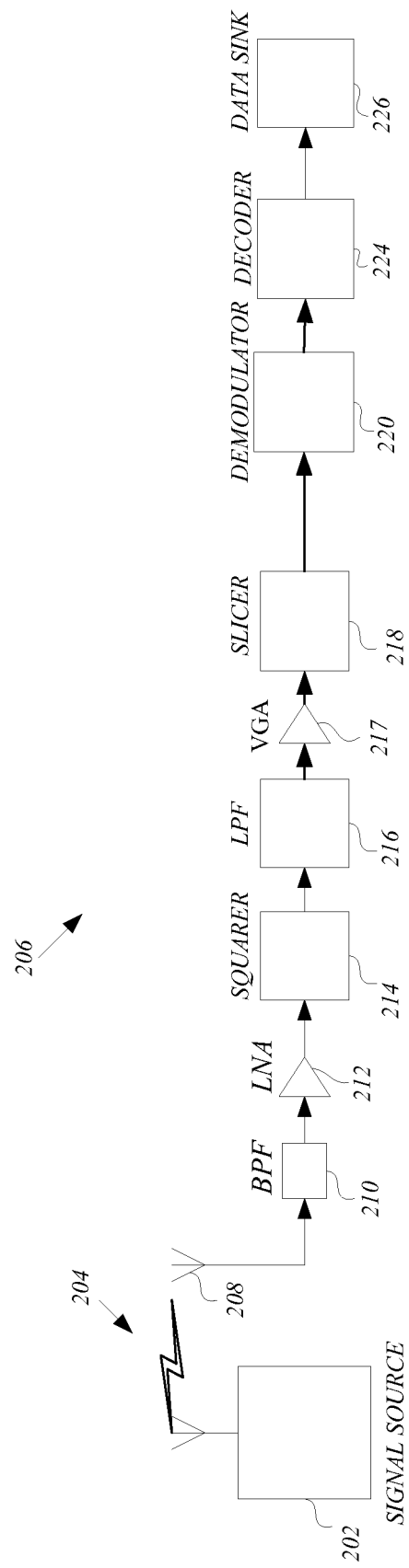
FIG. 2 is a schematic block diagram illustrating an example of a receiver.
Figure 3:
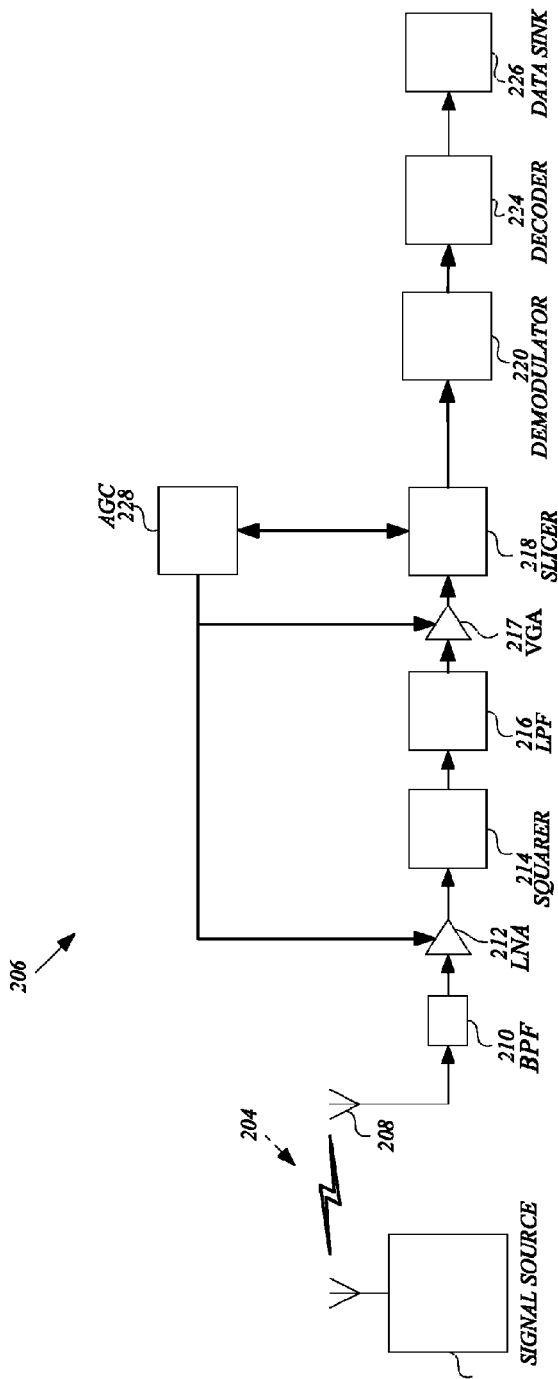
FIG. 3 is a schematic block diagram illustrating an example of a receiver with AGC.

Several examples of a receiver suitable for use in the wireless communications system described above, as well as other systems, will now be presented with reference to FIGS. 2-4.

Referring to FIG. 2, a signal source 202 generates information comprising encoded symbols and modulates a carrier signal with the information. The information may be encoded with convolutional codes, Turbo codes, or any other suitable coding scheme. The modulated carrier signal is then transmitted through a wireless channel 204 to a receiver 206.

At the receiver 206, the modulated carrier signal is processed by analog circuitry at the front end. A conceptual example of analog circuitry is shown in FIG. 2, which includes an antenna 208, a band pass filter (BPF) 210, a low noise amplifier (LNA) 212, a squarer 214, a low pass filter (LPF) 216, and a variable gain amplifier (VGA) 217. In this example, the modulated carrier signal is received at the antenna 208 and provided to the BPF 210 to remove out-of-band noise and interference received from the wireless channel 204. The filtered signal from the BPF 210 is provided to the LNA 212, which provides amplification with good noise performance. The amplified signal from the LNA 212 is then provided to the squarer 214. The squarer 214 is used to obtain the signal magnitude from the amplified signal. The squarer 214 may be implemented directly at RF, after down-conversion (not shown), or at an intermediate frequency. The signal from the squarer 214 is then provided to the LPF 216. Alternatively, the LPF 216 may be inherent in the squarer 214. The LPF 216 response may be fixed or adaptively controlled. The signal output from the LPF 216 is provided to the VGA 217 for further amplification.

The signal output from the VGA 217 is sampled by a slicer 218. The slicer 218 in this example is a 1-bit slicer, but could be an N-bit slicer where N is an additional system design parameter. The 1-bit slicer makes 1-bit decisions regarding the signal at a sampling frequency $f_s$. The sampling frequency may be fixed or adaptively controlled for performance optimization.

The sampled output from the slicer 218 is provided to a digital demodulator 220 to recover the data representative of the information carried by the signal transmitted by the signal source 202. The configuration of the demodulator 220 will depend upon the modulation scheme implemented at the signal source 202. As those skilled in the art will readily appreciate, the signal transmitted by the signal source 202 may be modulated by any of a multitude of well known modulation schemes. One example of a suitable demodulator 220 is described in U.S. patent application Ser. No. 12/099,686, the content of which is incorporated herein by reference.

The data recovered by the demodulator 220 is provided to a decoder 224 to convert the data comprised of encoded symbols into a digital bit stream for further processing by a data sink 226. The specific implementation of the data sink 226 will depend on the particular application. By way of example, the data sink may be a transducer for a headset, a user interface for a watch, and a sensor for a sensing device.

Referring to FIG. 3, a receiver 206 is shown with an AGC 228. The AGC 228 may be used to adaptively control the LNA gain, the VGA gain, and/or the slicer threshold. More specifically, the AGC 228 determines the LNA gain, VGA gain, and/or the slicer threshold based on noise and interference and not on the signal level. In this example, the LNA gain, VGA gain, and/or slicer threshold is determined during a time period (i.e., AGC scan) where the signal is not present. In some applications, however, the receiver 206 may not be able to ensure that the signal is not present during the AGC scan. In these applications, any performance loss due to the error in the estimated gain levels may be quantified and accounted for in the link margin. In some cases, there may be system specific solutions to mitigate any performance impact. By way of example, in time hopped UWB systems, the AGC scan may be performed without time-hopping which may aid in minimizing the likelihood of signal capture. Another way is to have a decision directed fine AGC control after acquisition.

During the AGC scan, the 1-bit slicer 218 outputs a series of bits, with each bit having one of two values (i.e., logic state "0" or logic state "1"). The AGC 228 evaluates the average percentage of "1"s output from the slicer 218 during the AGC scan and compares it with a pre-specified level. Alternatively, the AGC 228 may evaluate the average percentage of "0"s output from the slicer 218 and perform a similar comparison. The LNA gain, the VGA gain, the slicer threshold, or any combination thereof, is adjusted up or down to ensure that the target is met.

An example of an algorithm used by the AGC will now be described with respect to the flow chart illustrated in FIGS. 4A and 4B. The algorithm depicted in FIGS. 4A and 4B employs a bi-sectional search and assumes that the slicer threshold level remains constant and only the LNA and VGA gains are adjusted. However, as noted above, any combination of the amplifier gains and the slicer threshold may be controlled by the AGC algorithm. In the algorithm shown in FIGS. 4A and 4B, for a given gain level hypothesis, a "best" gain is determined and used to adjust the gain of either the LNA 212, the VGA 217, or both.

Figure 4A:
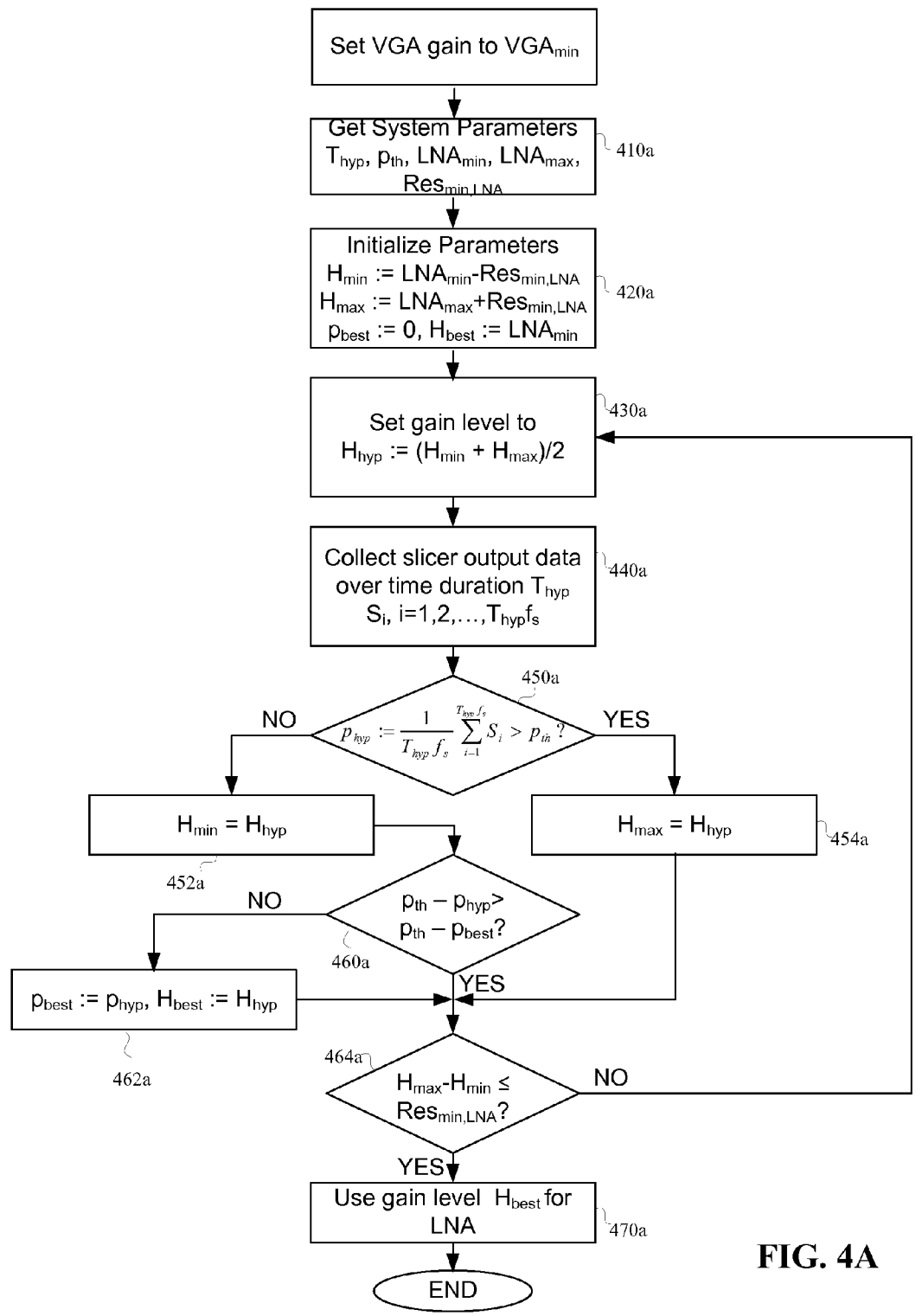
FIGS. 4A and 4B illustrate a flowcharts depicting an example of an AGC algorithm.

In FIG. 4A, the gain of the LNA 212 is set. In the aspect shown in FIG. 4A, the variable gain of the VGA 217 is set to the minimum gain of the VGA. As shown in block 410a of FIG. 4A, the AGC algorithm includes an initial step of obtaining system parameters. The system parameters in this example include a time period $T_{hyp}$ (in seconds) over which slicer outputs are collected. Ideally, this time period occurs when no target signal is received. System parameters further include a target for an average probability of 1's $p_{th}$ output by the slicer, minimum and maximum gain levels $LNA_{min}$, $LNA_{max}$ of a the LNA, and the minimum required gain resolution $Res_{min,LNA}$ for the LNA. The minimum required gain resolution may be determined during the system design process. For simplicity of description, the LNA gain levels are assumed to be equidistant in dB scale with the resolution $Res_{min,LNA}$. Further, the number of LNA gain levels is assumed to be $2^N-1$ where N is an integer. The extension to a general case is straightforward.

Further, in the algorithm shown in FIG. 4A, parameters "H" (i.e., $H_{min}$, $H_{max}$, $H_{hyp}$, $H_{best}$) are used to represent gain values or limits throughout the algorithm. The parameter $H_{best}$ represents the best available gain setting at any point. The parameter $H_{hyp}$ represents a gain level ("current gain level") for a current gain level hypothesis. Parameters $H_{min}$ and $H_{max}$ represent the minimum and maximum gain levels for a given hypothesis. A parameter $p_{best}$ represents a metric corresponding to the best available gain setting $H_{best}$, and a parameter $p_{hyp}$ represents the estimated probability of 1's at the slicer output when the gain level is $H_{hyp}$. In the algorithm of FIG. 4A, the minimum and maximum gain levels $LNA_{min}$, $LNA_{max}$ are assumed to be specified in dB.

The parameters for the minimum and maximum gain $H_{min}$, $H_{max}$, the best available gain setting $H_{best}$ and the metric $p_{best}$ corresponding to the best available gain setting are initialized as shown in block 420a of FIG. 4A. Initially, the minimum gain $H_{min}$ is assigned the value of the system parameter $LNA_{min} - Res_{min,LNA}$, and the maximum gain $H_{max}$ is assigned the value of the system parameter $LNA_{max} + Res_{min,LNA}$. For example, if $LNA_{min}=10$ dB, $LNA_{max}=20$ dB and $Res_{min,LNA}=1$ dB, $H_{min}$ is assigned to 9 dB and $H_{max}$ is assigned to 21 dB. The best available gain setting $H_{best}$ is initialized with the value of the system parameter $LNA_{min}$, and the metric $p_{best}$ corresponding to the best available gain setting $H_{best}$ is initialized with the value "0". In block 430a, the current gain level $H_{hyp}$ is set to the average value of the minimum and maximum gain, i.e., $(H_{min}+H_{max})/2$. For example, if $H_{min}=9$ dB and $H_{max}=21$ dB, $H_{hyp}$ is set to 15 dB.

The slicer obtains samples of the noise plus interference on the channel at a sampling frequency $f_s$ during the time period $T_{hyp}$ in which no target signal is received. The slicer output is collected as a value $S_i$, where $i=1, 2, \ldots, T_{hyp}f_s$, for every sample of the slicer, as shown in block 440a.

In block 450a, the estimated probability of 1's at the slicer output $p_{hyp}$ for the current gain level $H_{hyp}$ is set equal to the average value of the collected slicer output data, and a determination is made as to whether the estimated probability of 1's $p_{hyp}$ is greater than the target probability $p_{th}$. If the estimated probability of 1's $p_{hyp}$ at the slicer output for the current gain level $H_{hyp}$ is not greater than the target probability $p_{th}$ (i.e., a "no" decision in block 450a), the flow moves to block 452a, where the current gain level $H_{hyp}$ is set as the new value of the minimum gain level $H_{min}$. If the estimated probability $p_{hyp}$ is greater than the target probability $p_{th}$ (i.e., a "yes" decision in block 450a), the flow moves to block 454a, where the current gain level $H_{hyp}$ is set as the new value of the maximum gain level $H_{max}$.

In block 460a it is determined whether the difference between the estimated probability of 1's $p_{hyp}$ at the slicer output for the current gain level $H_{hyp}$ and the target probability $p_{th}$ ($p_{th}-p_{hyp}$) is greater than the difference between the metric $p_{best}$ and the target probability $p_{th}$ ($p_{th}-p_{best}$). If $p_{th}-p_{hyp}$ is greater than $p_{th}-p_{best}$ (i.e., a "yes" decision in block 460a), the flow control moves to block 464a. If $p_{th}-p_{hyp}$ is not greater than $p_{th}-p_{best}$ (i.e., a "no" decision in block 460a), the value of $p_{best}$ is updated to the value of $p_{hyp}$, and the value of $H_{best}$ is updated to the value of $H_{hyp}$ in block 462a, and then flow control moves to block 464a.

In block 464a, it is determined if the difference between the maximum and minimum gain values $H_{max}$ and $H_{min}$ ($H_{max}-H_{min}$) is less than or equal to the required minimum resolution $Res_{min,LNA}$.

If the difference between the maximum and minimum gain values ($H_{max}-H_{min}$) is less than or equal to the required minimum resolution $Res_{min,LNA}$ (i.e., a "yes" decision in block 464a), the best available gain setting $H_{best}$ is used as the gain level for the LNA. If ($H_{max}-H_{min}$) is greater than the required minimum resolution $Res_{min,LNA}$ (i.e., a "no" decision in block 464a) flow control is returned to block 430a, and the algorithm is reiterated from that point until ($H_{max}-H_{min}$) is not greater than the required minimum resolution $Res_{min,LNA}$, at which time the then current value of $H_{best}$ is used as the gain setting for the LNA 470a.

Figure 4B:
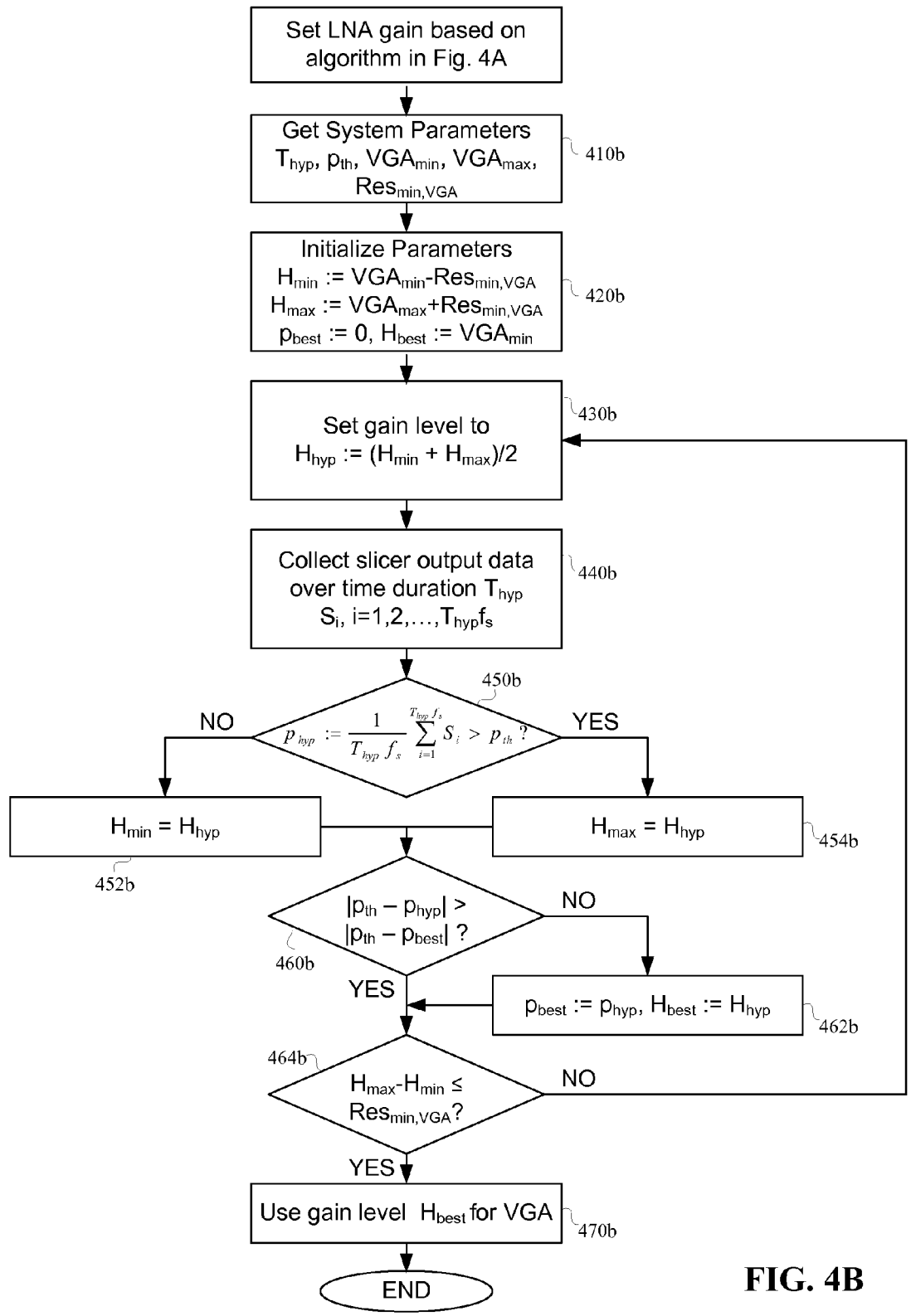

FIG. 4B illustrates an AGC algorithm for setting a gain level of the VGA 217 based on the LNA gain level determined in FIG. 4A. As shown in block 410b of FIG. 4B, the AGC algorithm includes an initial step of obtaining system parameters. In the aspect shown in FIG. 4B, the system parameters include a time period $T_{hyp}$ (in seconds) over which slicer outputs are collected. Ideally, this time period occurs when no target signal is received. System parameters further include a target for an average probability of 1's $p_{th}$ output by the slicer, minimum and maximum gain levels $VGA_{min}$, $VGA_{max}$ of the variable gain amplifier, and the minimum required gain resolution for the VGA $Res_{min,VGA}$. The minimum required gain resolution may be determined during the system design process. For simplicity of description, the VGA gain levels are assumed to be equidistant in dB scale with the resolution $Res_{min,VGA}$. Further, the number of VGA gain levels is assumed to be $2^N-1$ where N is an integer. The extension to a general case is straightforward.

Further, in the algorithm shown in FIG. 4B, parameters "H" (i.e., $H_{min}$, $H_{max}$, $H_{hyp}$, $H_{best}$) are used to represent gain values or limits throughout the algorithm. The parameter $H_{best}$ represents the best available gain setting at any point. The parameter $H_{hyp}$ represents a gain level ("current gain level") for a current gain level hypothesis. Parameters $H_{min}$ and $H_{max}$ represent the minimum and maximum gain levels for a given hypothesis. A parameter $p_{best}$ represents a metric corresponding to the best available gain setting $H_{best}$, and a parameter $p_{hyp}$ represents the estimated probability of 1's at the slicer output when the gain level is $H_{hyp}$. In the algorithm of FIG. 4B, the minimum and maximum gain levels $VGA_{min}$, $VGA_{max}$ are assumed to be specified in dB.

The parameters for the minimum and maximum gain $H_{min}$, $H_{max}$, the best available gain setting $H_{best}$ and the metric $p_{best}$ corresponding to the best available gain setting are initialized as shown in block 420b of FIG. 4B. Initially, the minimum gain $H_{min}$ is assigned the value of the system parameter $VGA_{min}-Res_{min,VGA}$, and the maximum gain $H_{max}$ is assigned the value of the system parameter $VGA_{max}+Res_{min,VGA}$. For example, if $VGA_{min}=10$ dB, $VGA_{max}=20$ dB and $Res_{min,VGA}=1$ dB, $H_{min}$ is assigned to 9 dB and $H_{max}$ is assigned to 21 dB. The best available gain setting $H_{best}$ is initialized with the value of the system parameter $VGA_{min}$, and the metric $p_{best}$ corresponding to the best available gain setting $H_{best}$ is initialized with the value "0". In block 430b, the current gain level $H_{hyp}$ is set to the average value of the minimum and maximum gain, i.e., $(H_{min}+H_{max})/2$. For example, if $H_{min}=9$ dB and $H_{max}=21$ dB, $H_{hyp}$ is set to 15 dB.

The slicer obtains samples of the noise plus interference on the channel at a sampling frequency $f_s$ during the time period $T_{hyp}$ in which no signal is received. The slicer output is collected as a value $S_i$, where $i=1, 2, \ldots, T_{hyp}f_s$, for every sample of the slicer, as shown in block 440b.

In block 450b, the estimated probability of 1's at the slicer output $p_{hyp}$ for the current gain level $H_{hyp}$ is set equal to the average value of the collected slicer output data, and a determination is made as to whether the estimated probability of 1's $p_{hyp}$ is greater than the target probability $p_{th}$. If the estimated probability of 1's $p_{hyp}$ at the slicer output for the current gain level $H_{hyp}$ is not greater than the target probability $p_{th}$ (i.e., a "no" decision in block 450b), the flow moves to block 452b where the current gain level $H_{hyp}$ is set as the new value of the minimum gain level $H_{min}$. If the estimated probability $p_{hyp}$ is greater than the target probability $p_{th}$ (i.e., a "yes" decision in block 450b), the flow moves to block 454b, where the current gain level $H_{hyp}$ is set as the new value of the maximum gain level $H_{max}$.

In block 460b it is determined whether the absolute value of the difference between the estimated probability of 1's $p_{hyp}$ at the slicer output for the current gain level $H_{hyp}$ and the target probability $p_{th}$ ($|p_{th}-p_{hyp}|$) is greater than the absolute value of the difference between the metric $p_{best}$ and the target probability $p_{th}$ ($|p_{th}-p_{best}|$). If $|p_{th}-p_{hyp}|$ is greater than $|p_{th}-p_{best}|$ (i.e., a "yes" decision in block 460b), the flow control moves to block 464b. If $|p_{th}-p_{hyp}|$ is not greater than $|p_{th}-p_{best}|$ (i.e., a "no" decision in block 460b), the value of $p_{best}$ is updated to the value of $p_{hyp}$, and the value of $H_{best}$ is updated to the value of $H_{hyp}$ in block 462b, and then flow control moves to block 464b.

In block 464b, it is determined if the difference between the maximum and minimum gain values $H_{max}$ and $H_{min}$ ($H_{max}-H_{min}$) is less than or equal to the required minimum resolution $Res_{min,VGA}$.

If the difference between the maximum and minimum gain values ($H_{max}-H_{min}$) is less than or equal to the required minimum resolution $Res_{min,VGA}$ (i.e., a "yes" decision in block 464b), the best available gain setting $H_{best}$ is used as the VGA gain level. If ($H_{max}-H_{min}$) is greater than the required minimum resolution $Res_{min,VGA}$ (i.e., a "no" decision in block 464b) flow control is returned to block 430b, and the algorithm is reiterated from that point until ($H_{max}-H_{min}$) is not greater than the required minimum resolution $Res_{min,VGA}$, at which time the then current value of $H_{best}$ is used as the VGA gain setting 470b.

Although described in the context of a single target value $p_{th}$, it should be readily apparent to one of ordinary skill in the art that the system and concepts described herein may be expanded to include a target $p_{th}$ encompassing a region of probabilities.

Referring to FIG. 3, the AGC 228 may be implemented or performed with a general purpose processor, a microcontroller, a digital signal processor (DSP), an application specific integrated circuit (ASIC), a field programmable gate array (FPGA), a programmable logic device, a controller, a state machine, discrete hardware components, or any combination thereof, or other suitable entity or entities that can perform the various functions described throughout this disclosure. The AGC 228 may also include, or be supported by, one or more machine-readable medium for storing software. Software shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

Machine-readable media includes any medium that facilitates transfer of software from one place to another. By way of example, machine-readable media may include RAM, ROM, EEPROM, CD-ROM or other optical disk storage, magnetic disk storage or other magnetic storage devices, or any other medium that can be used to carry or store software in the form of instructions or data structures and that can be accessed by the processing system. Also, any connection is properly termed a machine-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Combinations of the above should also be included within the scope of machine-readable media. Moreover, in some aspects any suitable computer-program product may comprise a computer-readable medium or machine-readable medium comprising codes relating to one or more of the aspects of the disclosure. In some aspects a computer program product may comprise packaging materials.

Figure 5:
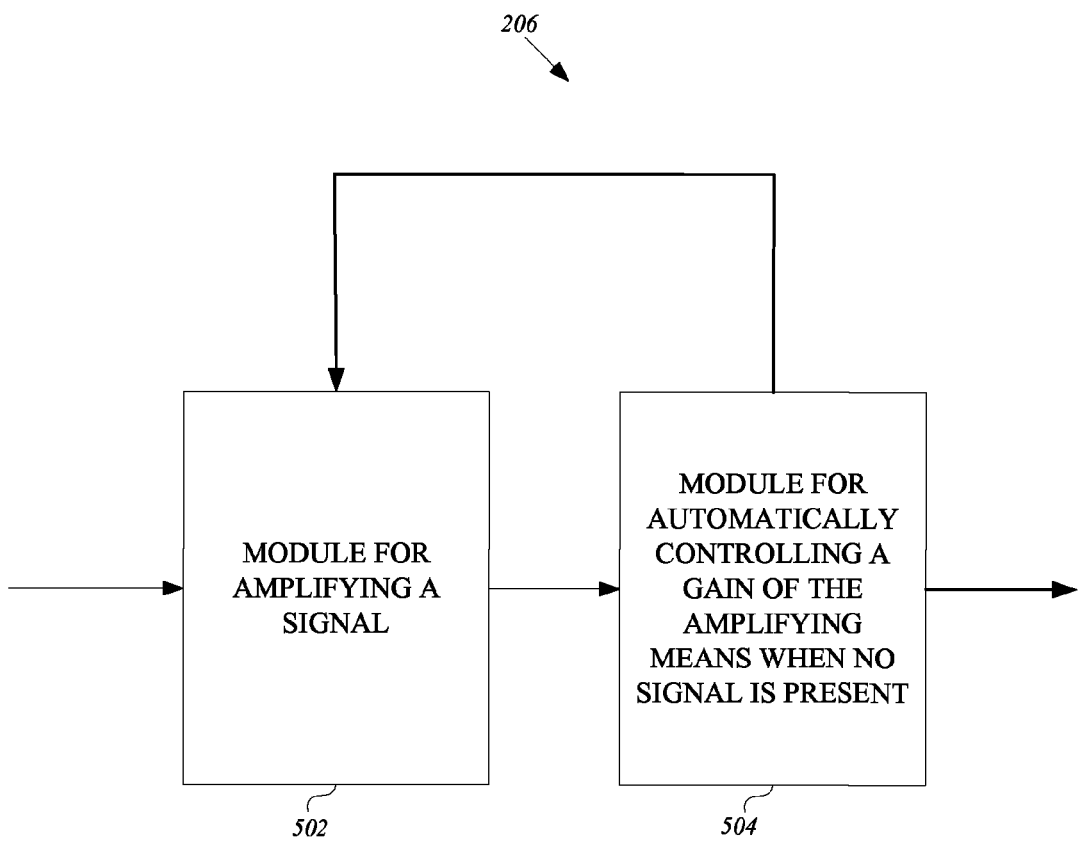
FIG. 5 is a conceptual block diagram illustrating an example of the functionality of the receiver.

FIG. 5 is a conceptual block diagram illustrating an example of the functionality of the receiver 206. In this example, the receiver 206 includes means 502 for amplifying a target signal and means 504 for automatically controlling a gain for the amplifying means based on an output from the amplifying means during a time period in which a signal is not present at the output of the amplifying means.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An apparatus for wireless communications, comprising:
an amplifier;
an automatic gain control configured to determine a gain for the amplifier based on an output from the amplifier during a time period in which a target signal is not present at the output of the amplifier; and
a slicer configured to sample the output from the amplifier, wherein the automatic gain control is further configured to determine the gain for the amplifier from the samples during the time period;
wherein the automatic gain control is further configured to:
process the samples;
compare the processed samples to a threshold; and
determine the gain for the amplifier based on the comparison; and
further wherein each of the samples output from the slicer comprises a first or second value, the automatic gain control being further configured to:
compare a percentage of samples having the first value to a threshold percentage during the time period; and
determine the gain for the amplifier based on the comparison.

2. The apparatus of claim 1 wherein the automatic gain control is further configured to determine the gain for the amplifier based on the output from the amplifier during a second time period in which the target signal is present at the output of the amplifier.

3. The apparatus of claim 1 wherein the slicer comprises a 1-bit slicer.

4. The apparatus of claim 1 wherein the first value comprises a logic state 1 and the second value comprises a logic state of 0.

5. The apparatus of claim 1 wherein the first value comprises a logic state of 0 and the second value comprises a logic state of 1.

6. The apparatus of claim 1 further comprising a second amplifier, wherein the automatic gain control is further configured to determine a gain for the second amplifier from the samples output from the slicer during the time period.

7. The apparatus of claim 6 wherein one of the amplifier and second amplifier comprises a low noise amplifier and the other one of the amplifier and second amplifier comprises a variable gain amplifier.

8. The apparatus of claim 1 wherein the amplifier comprises either a low noise amplifier or a variable gain amplifier.

9. An apparatus for wireless communications, comprising:
an amplifier;
an automatic gain control configured to determine a gain for the amplifier based on an output from the amplifier during a time period in which a target signal is not present at the output of the amplifier; and
a slicer configured to sample the output from the amplifier, wherein the automatic gain control is further configured to determine the gain for the amplifier from the samples during the time period, wherein the slicer is further configured to sample the output from the amplifier based on a threshold, and wherein the automatic gain control is further configured to determine the threshold for the slicer from the samples during the time period.

10. The apparatus of claim 9 wherein the automatic gain control is further configured to:
obtain a minimum required gain resolution;
recursively set minimum and maximum hypothetical gain parameters and a best hypothetical gain parameter based on system parameters until a difference between the minimum and maximum hypothetical gain parameters is equal to or less than the minimum required gain resolution; and
determine the gain for the amplifier based on the best hypothetical gain parameter.

11. An apparatus for wireless communications, comprising:
means for amplifying a target signal;
means for automatically controlling a gain for the amplifying means based on an output from the amplifying means during a time period in which the target signal is not present at the output of the amplifying means; and
means for sampling the output from the amplifying means, wherein the means for automatically controlling a gain for the amplifying means further comprises means for determining the gain for the amplifying means from the samples during the time period;

wherein the means for automatically controlling a gain of the amplifying means further comprises:
 means for processing the samples output from the sampling means;
 means for comparing the processed samples to a threshold; and
 means for determining the gain for the amplifier based on the comparison; and
 further wherein each of the samples output from the sampling means comprises a first or second value, the means for automatically controlling a gain of the amplifying means further comprising:
  means for comparing a percentage of samples having the first value to a threshold percentage during the time period; and
  means for determining the gain for the amplifying means based on the comparison.

12. The apparatus of claim 11 wherein the means for automatically controlling a gain for the amplifying means further comprises means for determining the gain for the amplifying means based on the output from the amplifying means during a second time period in which the target signal is present at the output of the amplifying means.

13. The apparatus of claim 11 wherein the sampling means comprises a slicer.

14. The apparatus of claim 13 wherein the slicer comprises a 1-bit slicer.

15. The apparatus of claim 11 wherein the first value comprises a logic state 1 and the second value comprises a logic state of 0.

16. The apparatus of claim 11 wherein the first value comprises a logic state of 0 and the second value comprises a logic state of 1.

17. The apparatus of claim 11 further comprising a second means for amplifying the target signal, wherein the means for automatically controlling a gain of the amplifying means further comprises means for determining a gain for the second amplifying means from the samples output from the sampling means during the time period.

18. The apparatus of claim 17 wherein one of the amplifying means and the second amplifying means comprises a low noise amplifier and the other one of the amplifying means and the second amplifying means comprises a variable gain amplifier.

19. The apparatus of claim 11 wherein the amplifying means comprises either a low noise amplifier or a variable gain amplifier.

20. An apparatus for wireless communications, comprising:
 means for amplifying a target signal;
 means for automatically controlling a gain for the amplifying means based on an output from the amplifying means during a time period in which the target signal is not present at the output of the amplifying means; and
 means for sampling the output from the amplifying means, wherein the means for automatically controlling a gain for the amplifying means further comprises means for determining the gain for the amplifying means from the samples during the time period;
 wherein the sampling means is configured to sample the outputs from the amplifying means based on a threshold, the apparatus further comprising means for determining the threshold for the sampling means from the samples output from the sampling means during the time period.

21. The apparatus of claim 20 wherein the means for automatically controlling a gain of the amplifying means further comprises:
 means for obtaining a minimum required gain resolution;
 means for recursively setting minimum and maximum hypothetical gain parameters and a best hypothetical gain parameter based on the system parameters until a difference between the minimum and maximum hypothetical gain parameters is equal to or less than the minimum required gain resolution; and
 means for determining the gain for the amplifying means based on the best hypothetical gain parameter.

22. A method of automatic gain control, comprising:
 amplifying a target signal with an amplifier;
 automatically controlling a gain for the amplifier based on an output from the amplifier means during a time period in which the target signal is not present at the output of the amplifier and
 sampling the output from the amplifier, wherein the automatic control of the gain further comprises determining the gain for the amplifier from the samples during the time period;
 wherein the automatic control of the gain further comprises:
  processing the samples;
  comparing the processed samples to a threshold; and
  determining the gain for the amplifier based on the comparison; and
 further wherein each of the samples comprises a first or second value, the automatic control of the gain further comprises:
  comparing a percentage of samples having the first value to a threshold percentage during the time period; and
  determining the gain for the amplifier based on the comparison.

23. The method of claim 22 wherein the automatic control of the gain comprises determining the gain for the amplifier based on the output from the amplifier during a second time period in which the target signal is present at the output of the amplifier.

24. The method of claim 22 wherein the first value comprises a logic state 1 and the second value comprises a logic state of 0.

25. The method of claim 22 wherein the first value comprises a logic state of 0 and the second value comprises a logic state of 1.

26. The method of claim 22 further comprising a second amplifier, wherein the automatic control of the gain further comprises determining a gain for the second amplifier from the samples during the time period.

27. A method of automatic gain control, comprising:
 amplifying a target signal with an amplifier;
 automatically controlling a gain for the amplifier based on an output from the amplifier means during a time period in which the target signal is not present at the output of the amplifier; and
 sampling the output from the amplifier, wherein the automatic control of the gain further comprises determining the gain for the amplifier from the samples during the time period;
 wherein the sampling of the output from the amplifier is based on a threshold, and wherein the automatic control of the gain further comprises determining the threshold during the time period.

28. The method of claim 27 wherein the automatic control of the gain further comprises:
 obtaining a minimum required gain resolution;
 recursively setting minimum and maximum hypothetical gain parameters and a best hypothetical gain parameter based on system parameters until a difference between the minimum and maximum hypothetical gain parameters is equal to or less than the minimum required gain resolution; and determining the gain for the amplifier based on the best hypothetical gain parameter.

29. A computer-program product for automatically controlling a gain of an amplifier, comprising:
a non-transitory computer-readable medium encoded with codes executable to:
amplify a target signal with an amplifier;
automatically control a gain for the amplifier based on an output from the amplifier during a time period in which a target signal is not present at the output of the amplifier; and
sample the output from the amplifier, wherein the automatic control of the gain comprises determining the gain for the amplifier from the samples during the time period;
wherein the automatic control of the gain further comprises:
processing the samples;
comparing the processed samples to a threshold; and
determining the gain for the amplifier based on the comparison; and
further wherein each of the samples comprises a first or second value, and the automatic control of the gain further comprises:
comparing a percentage of samples having the first value to a threshold percentage during the time period; and
determining the gain for the amplifier based on the comparison.

30. A headset, comprising:
an amplifier;
an automatic gain control configured to determine a gain for the amplifier based on an output from the amplifier during a time period in which a target signal is not present at the output of the amplifier;
a slicer configured to sample the output from the amplifier, wherein the automatic gain control is further configured to determine the gain for the amplifier from the samples during the time period;
wherein the automatic gain control is further configured to:
process the samples;
compare the processed samples to a threshold; and
determine the gain for the amplifier based on the comparison; and
further wherein each of the samples output from the slicer comprises a first or second value, the automatic gain control being further configured to:
compare a percentage of samples having the first value to a threshold percentage during the time period; and
determine the gain for the amplifier based on the comparison; and
a transducer configured to generate sound based on the target signal.

31. A watch, comprising:
an amplifier;
an automatic gain control configured to determine a gain for the amplifier based on an output from the amplifier during a time period in which a target signal is not present at the output of the amplifier;
a slicer configured to sample the output from the amplifier, wherein the automatic gain control is further configured to determine the gain for the amplifier from the samples during the time period;
wherein the automatic gain control is further configured to:
process the samples;
compare the processed samples to a threshold; and
determine the gain for the amplifier based on the comparison; and
further wherein each of the samples output from the slicer comprises a first or second value, the automatic gain control being further configured to:
compare a percentage of samples having the first value to a threshold percentage during the time period; and
determine the gain for the amplifier based on the comparison; and
a user interface configured to provide an indication based on the target signal.

32. A sensing device, comprising:
an amplifier;
an automatic gain control configured to determine a gain for the amplifier based on an output from the amplifier during a time period in which a target signal is not present at the output of the amplifier;
a slicer configured to sample the output from the amplifier, wherein the automatic gain control is further configured to determine the gain for the amplifier from the samples during the time period;
wherein the automatic gain control is further configured to:
process the samples;
compare the processed samples to a threshold; and
determine the gain for the amplifier based on the comparison; and
further wherein each of the samples output from the slicer comprises a first or second value, the automatic gain control being further configured to:
compare a percentage of samples having the first value to a threshold percentage during the time period; and
determine the gain for the amplifier based on the comparison; and
a sensor configured to generate data based on the target signal.

* * * * *